United States Patent [19]
Wada et al.

[11] Patent Number: 5,694,059
[45] Date of Patent: Dec. 2, 1997

[54] BUFFER OF FINE CONNECTION STRUCTURE FOR CONNECTING AN ATOM LEVEL CIRCUIT AND A GENERAL SEMICONDUCTOR CIRCUIT

[75] Inventors: Yasuo Wada, Tokyo; Munehisa Mitsuya; Yasushi Tomioka, both of Sakado; Mark L. Lutwyche, Higashimatsuyama; Seiichi Kondo; Seiji Heike, both of Saitama-ken, all of Japan

[73] Assignee: Hitachi Ltd., Tokyo, Japan

[21] Appl. No.: 383,843

[22] Filed: Feb. 6, 1995

Related U.S. Application Data

[63] Continuation-in-part of Ser. No. 994,968, Dec. 22, 1992, Pat. No. 5,561,300.

[30] Foreign Application Priority Data

| Dec. 24, 1991 | [JP] | Japan | ................. | 3-340649 |
| Dec. 26, 1991 | [JP] | Japan | ................. | 3-344357 |
| Feb. 6, 1992 | [JP] | Japan | ................. | 4-020972 |
| Sep. 22, 1992 | [JP] | Japan | ................. | 4-252511 |
| Feb. 4, 1994 | [JP] | Japan | ................. | 6-012390 |
| Apr. 26, 1994 | [JP] | Japan | ................. | 6-088180 |

[51] Int. Cl.$^6$ .................................. H03K 19/0175
[52] U.S. Cl. .................................. 326/62; 326/63
[58] Field of Search .................. 326/62, 63, 82

[56] References Cited

U.S. PATENT DOCUMENTS

| 5,244,828 | 9/1993 | Okada et al. | ................. | 437/81 |
| 5,264,711 | 11/1993 | Dutta et al. | ................. | 257/14 |
| 5,298,760 | 3/1994 | Fuchs et al. | ................. | 250/492.2 X |
| 5,327,625 | 7/1994 | Clark, Jr. et al. | ................. | 29/25.01 |
| 5,365,073 | 11/1994 | White | ................. | 250/492.2 X |
| 5,381,753 | 1/1995 | Okajima et al. | ................. | 117/12 |
| 5,426,311 | 6/1995 | Webb | ................. | 257/9 |
| 5,436,191 | 7/1995 | Paell et al. | ................. | 437/110 |

FOREIGN PATENT DOCUMENTS

A-427443  10/1990  European Pat. Off.

OTHER PUBLICATIONS

Wada et al., "A proposal of nanoscale devices based on atom/molecule switching", J. Appl. Phys. 74 (12), 15 Dec. 1993, pp. 7321–7328.

"Integrated Circuit Packaging Technology", Nikkei BP, pp. 36–39, 1990.

*Nature*, vol. 344, Apr. 5, 1990, Eigler et al. "Positioning Single Atoms With a Scanning Tunnelling Microscope", pp. 524–526.

*Elektronik*, 21/1991, vol. 40, No. 21, Oct. 15, 1991, "Einzelnes Atom als Elektrischer Schalter"., p. 39.

*Primary Examiner*—David R. Hudspeth
*Attorney, Agent, or Firm*—Antonelli, Terry, Stout, & Kraus, LLP

[57] ABSTRACT

A buffer circuit ID provided for connecting an atom level device (for example, an Atom Relay Transistor circuit), formed by arranging atoms in a predetermined pattern, to a device such as a semiconductor device and a quantum device. The buffer circuit can be formed as a voltage or current amplification circuit. The voltage amplification circuit may be a single electron transistor circuit, and the current amplification circuit may be an avalanche amplification device circuit. The Atom Relay Transistor circuit and the device such as a semiconductor device and a quantum device are formed substantially on the same flat insulating member, and connected by a fine connection structure made of a conductive body such as metal.

12 Claims, 7 Drawing Sheets

BUFFER OF FINE CONNECTION STRUCTURE FOR CONNECTING AN ATOM LEVEL CIRCUIT AND A GENERAL SEMICONDUCTOR CIRCUIT

CROSS-REFERENCE TO RELATED APPLICATIONS

This application is a continuation-in-part of an application U.S. Ser. No. 07/994,968 entitled "ATOMIC SWITCHING DEVICE AND LOGICAL CIRCUITS AND METHOD OF MANUFACTURING THE SAME" filed by Wada et al. on Dec. 22, 1992, and now U.S. Pat. No. 5,561,300 the disclosure of which is incorporated herein by reference.

This application is related with an application Ser. No. 08/043,893 filed Apr. 7, 1993.

BACKGROUND OF THE INVENTION

1. Field of the Invention

The present invention relates to a novel circuit, and more particularly to a high performance connection circuit and a method of manufacturing the same, the connection circuit connecting an atom level device circuit to a semiconductor device/circuit, or to a quantum device and/or an atom-atom level device.

2. Description of the Related Art

In a conventional semiconductor integrated circuit, semiconductor chips and other circuit elements on a package are electrically connected by wire bonding, by using solder bumps, or by other methods (refer, for example, to "Integrated Circuit Packaging Technology". pp. 36–39, Nikkei BP, 1990).

The device structure of a conventional semiconductor integrated circuit has a physical limit of a channel length of about 0.1 µm. It is therefore physically impossible to realize an integrated circuit for an information processing system having a device with a channel length of about 0.1 µm or shorter. In order to realize a high performance information processing system, an information processing device having a performance higher than a conventional semiconductor device has been long desired.

To meet such physical requirements, the present inventors have proposed an ultra-fine switching device (JP-A-5-175513: Wada, et al., J. Appl. Phys., 74, 7321 (1993)). This ultra-fine switching device is constituted by an atom wire formed by atoms disposed in a predetermined pattern and a switching element (Atom Relay Transistor) with a switching function, and has a size one thousandth or smaller than a conventional semiconductor integrated circuit element and a high speed performance 1000 times or more faster than a conventional element. In order to externally control an atom level switching device including an Atom Relay Transistor and in order to use it as a main constituent device of an information processing system, it is necessary to use a connection structure for connection to the atom level switching device.

The connection structure is required to be sufficiently compatible with the ultra-high speed operation of an atom relay transistor, and to drive a display device and other external circuits for man-machine interface. It is also necessary for the connection structure to be compatible with the voltage level of semiconductor devices of such a display device and external circuits.

The fine connection structure is required to be connected to an Atom Relay Transistor which has a size of atom level of about 0.2 nm and to a semiconductor device or a quantum device which has a size of 100 nm or larger.

The switching device is also required to be formed on an insulating substrate. A fine connection structure satisfying all these requirements has been impossible to be realized by conventional techniques.

SUMMARY OF THE INVENTION

The invention provides a circuit with a high performance connection structure for connecting an ultra-high speed, ultra-high density information processing atom level circuit to a semiconductor circuit and a method of manufacturing such a circuit. A buffer element constituting the connection structure is interposed at least between an atom level circuit and a semiconductor circuit, and provides a function of matching the input/ output levels of the atom level circuit with those of the semiconductor circuit.

The invention has been made to solve the problems associated with this technical field. As described earlier, an ultra-high speed, ultra-high density information processing circuit (hereinafter called an Atom Relay Transistor circuit, and denoted as an ART circuit), including atom wires formed by arranging atoms in a predetermined pattern and switching elements for switching atom wires, realizes a logical circuit or a memory circuit by using several electrons. On the other hand, a semiconductor circuit used for transferring a signal to and from an external circuit requires electrons of tens of thousands to several millions.

Therefore, the connection circuit interposed between the ART circuit and the semiconductor circuit is required to amplify the output signal of the ART circuit at ultra-high speed by several thousand-holds to several million-folds. For the reliable information processing, an input signal of tera Hertz level is required to be processed in real time and outputted to the semiconductor circuit.

To achieve the above objects of the invention, as shown in FIG. 1, a connection circuit 12 disposed intermediately between an ART circuit 11 and a semiconductor circuit 13 provides means for amplifying a signal at ultra-high speed in terms of both voltage and current. In the circuit arrangement shown in FIG. 1, a signal transmission line 14 between the ART circuit 11 and the connection circuit 12 transfers input/output signals to and from the ART circuit 11 by the amount of several electrons to several hundred electrons, and a signal transmission line 15 between the connection circuit 12 and the semiconductor circuit 13 transfers input/ output signals to and from the semiconductor circuit 13 by the amount of tens of thousands of electrons to several million electrons.

An ART circuit structure constituted by atom wires formed by arranging atoms in a predetermined pattern and atom relay transistors with a switching function, has generally a width of about 0.2 nm at its atom wire train which is a fundamental structure of the ART circuit. On the other hand, the size of a device such as a semiconductor device and a quantum device is about 100 nm at the minimum which is greater about 3 digits than the size of an ART circuit. The size of a connection circuit itself is therefore required to cover this size difference between a fine structure of about 0.2 nm and another structure of about 100 nm. The outer size r of the connection circuit structure is therefore required to satisfy the following formula:

$$0.2 \text{ nm} < r < 100 \text{ nm} \tag{1}$$

If this size range is satisfied, the connection circuit of the invention may be made of any material to achieve the gist of the invention.

The size difference by three digits between 0.2 nm and 100 nm should be covered by the connection circuit connecting an atom level device to a semiconductor device. In order to meet this requirement, the connection circuit is required to have a size in the range of the formula (1). The connection circuit structure having a size in this size range, particularly in the range of from 1 nm to 50 nm, is proved to be optimum. If the size of a device such as a semiconductor device and a quantum device is 100 nm or larger, the maximum size of a connection circuit structure increases correspondingly. For example, if the size is 500 nm, the optimum size range is from 1 nm to 300 nm.

As materials of devices of a connection circuit, conductive materials such as metals and semiconductors are generally proper. Of metals, materials relatively rich in malleability, such as gold, platinum, and aluminum may be used.

FIG. 6 is a schematic diagram showing a structure of a circuit with a fine connection structure. A fine connection structure 64 is interposed between an atom level device 62 and a device 63 such as a semiconductor device and a quantum device, respectively formed on an insulating substrate 61. The fine connection structure 64 electrically connects the atom level device 62 and the device 63 such as a semiconductor device and a quantum device.

Another requirement for the fabrication of such a connection structure is that both the atom level device 62 and the device 63 such as a semiconductor device and a quantum device are formed on substantially the same flat surface. If they are formed on the surfaces having any step, the connection therebetween by the connection structure becomes very difficult and an electrical connection becomes unable to be established at the worst. The maximum allowance of the thickness of each device is an atom level in the case of the atom level device, a thickness level of films in the case of the device such as a semiconductor device and a quantum device, and a thickness level of films in the case of the connection structure.

The material of a substrate of a fine connection structure is required to be an insulating material. In achieving the gist of the invention, the material of the substrate may be a compound insulating material such as aluminum oxide and silicon oxide, a single element insulating material such as diamond, a semiconductor insulating material such as silicon and gallium arsenide which becomes an insulating material when cooled, a mixture of any ones of these materials, or a compound of any ones of these materials. Of these, particularly, aluminum oxide single crystal, silicon oxide grown on a silicon wafer, and diamond are proved to be optimum for an insulating substrate.

As a means for amplifying a signal in terms of voltage in the connection circuit 12 interposed between the ART circuit 11 and the semiconductor circuit 13, for example, a circuit (hereinafter called a SET circuit) formed by single electron transistors (SET) may be used. The reason why a SET circuit can be used for voltage-amplifying an output of an ART circuit, will be explained. A voltage V of a quantum dot is expressed by the following equation:

$$V = e/2C \quad (2)$$

wherein C represents a capacitance of a quantum dot of a SET circuit, and e represents an electric charge of an electron. According to this equation, if a size of a quantum dot of each SET transistor of a SET circuit is made small and the capacitance thereof is made sufficiently small, one electron can be amplified to have a potential of several hundreds mV or higher necessary for a semiconductor circuit. This output supplied to a semiconductor circuit is further amplified to allow it to drive a man-machine interface device. The connection circuit is not necessarily a SET circuit, but other circuits may also be used if they can amplify a voltage signal.

As a means for amplifying a signal in terms of current in the connection circuit 12 interposed between the ART circuit 11 and the semiconductor circuit 13, for example, a circuit (hereinafter called an AAD circuit) formed by avalanche amplification devices (AAD) may be used. One electron from an ART circuit can be amplified by an AAD circuit through avalanche amplification to have a sufficient number of electrons necessary for driving a semiconductor circuit. The connection circuit is not necessarily a SET circuit, but other circuits may also be used if they can amplify a current signal.

DESCRIPTION OF THE PREFERRED EMBODIMENTS

Figure 1:
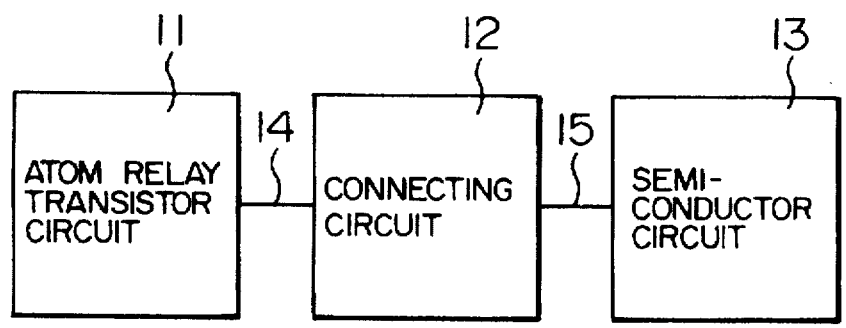
FIG. 1 is a block diagram showing the fundamental structure of a connection circuit with an atom level circuit and a semiconductor circuit according to the invention.
Figure 2:
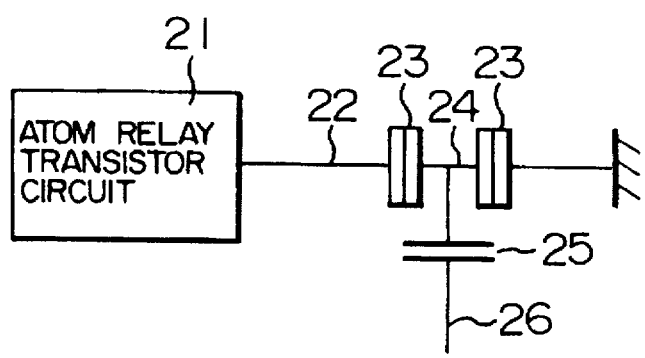
FIG. 2 is a schematic diagram showing an circuit arrangement in which an output of an ART circuit is voltage-amplified by a SET circuit.

Embodiments of the invention will be described in detail with reference to the accompanying drawings.
First Embodiment This embodiment discloses voltage amplification by a SET (single electron transistor) circuit. In the schematic diagram shown in FIG. 2, an output 22 from an ART (Atom Relay Transistor) circuit 21 is supplied to a SET circuit having a tunneling junction 23, quantum dots (atom wire) 24, and a gate 25. Although the number of electrons of the output 22 of the ART circuit 21 is one to several tens, the voltage at the quantum dots can be made sufficiently large according to the equation (2) if the size of each quantum dot 24 is made sufficiently small to reduce a capacitance thereof.

In this embodiment, with the size of the quantum dot being set to 1 nm, a voltage amplified to 500 mV is obtained. This voltage is picked up by the gate 25 through capacitance coupling, and the output 26 is supplied to a circuit (hereinafter called a HEMT circuit) formed by high electron mobility transistors (HEMT) and further amplified. An output of the HEMT circuit is supplied to a display device to be driven by a silicon integrated circuit. With these circuits a computer system can be realized.

Second Embodiment

This embodiment discloses current amplification of an output of an ART circuit. In the schematic diagram shown in FIG. 3, an electron output 32 of an ART circuit 31 is amplified by an amplification function part 33 of an AAD circuit connected to a power supply 34, and an output 35 thereof is supplied to a semiconductor circuit 36.

In the arrangement of this embodiment, the avalanche amplification part is the most important part since its dead time determines the total performance of the AAD circuit. If the dead time is long, an output cannot follow an input of very high frequency. As a result, in order to sufficiently shorten a response time of the AAD circuit, the size of the avalanche amplification part is required to be small. In this embodiment, with the length of the avalanche amplification part of the AAD circuit being set to 0.1 µm, a frequency of 1 tera Hertz (1 THz) is ensured.

Third Embodiment

Figure 3:
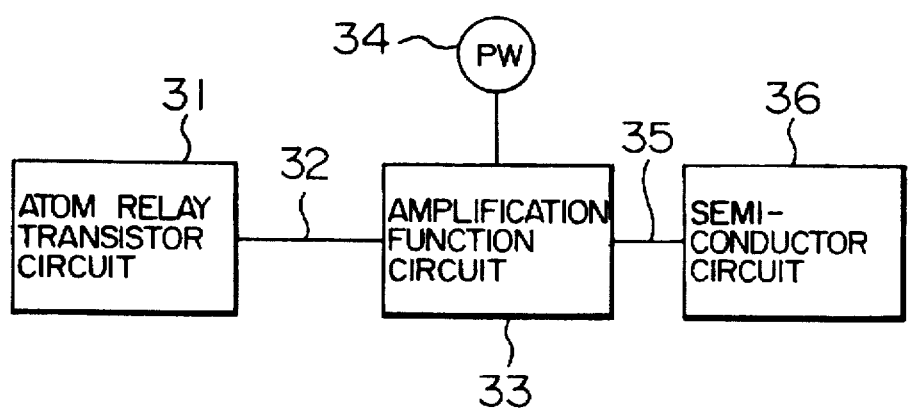
FIG. 3 is a schematic diagram showing an circuit arrangement in which an output of an ART circuit is current-amplified by an avalanche amplification device (AAD) circuit.
Figure 4:
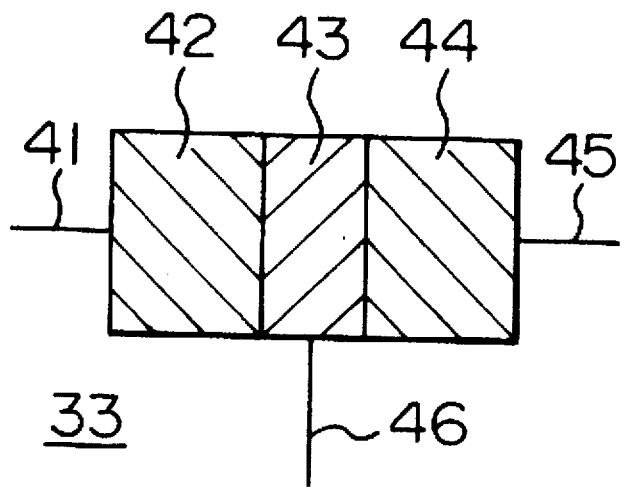
FIG. 4 is a diagram explaining a current amplification function of an AAD circuit.

This embodiment discloses an example of the structure of the avalanche amplification part 33 of the AAD circuit shown in FIG. 3. FIG. 4 shows an example of the structure of the avalanche amplification part 33 of the AAD circuit, the avalanche amplification part including n-type indium phosphide (InP) layers 42 and 44, a p-type InP layer 43 interposed between the layers 42 and 44, an input electrode 46, an output electrode 45, and an electrode 41 connected to a power supply. The power supply connected to the electrode 41 applies a high electric field between the n-type InP layers 42 and 44.

An output signal at the input electrode 46 from the ART circuit is therefore subjected to avalanche amplification in the p-type InP layer 43. A current amplification factor can be controlled to be between several hundreds to several millions, depending upon an electric field applied between the n-type InP layers 42 and 44.

The length of the avalanche amplification part affecting the dead time of the AAD circuit corresponds to the width of the p-type InP layer 43 interposed between the n-type InP layers 42 and 44.

Although the material of the avalanche amplification part of this embodiment is indium phosphide, other materials such as compound semiconductors and single element semiconductors made of, for example, silicon, may also be used with the similar advantageous effects. As the thickness of the p-type InP layer 43 is made smaller, the amplification performance becomes better.

In this embodiment, a good amplification factor of about one hundred of thousands can be obtained by using the p-type InP layer 43 formed on an n-type InP substrate to a thickness of 20 nm by molecular beam epitaxy and by an applied electric field of $10^6$ V/µm.

Fourth Embodiment

Figure 5:
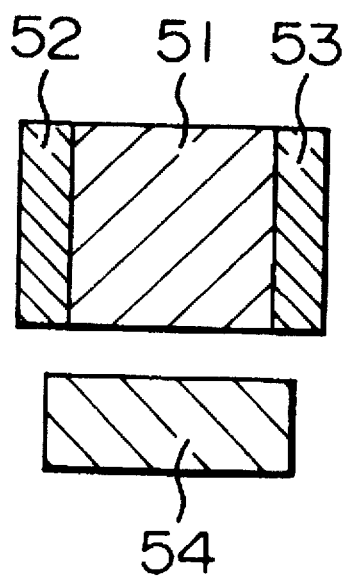
FIG. 5 is a diagram explaining a voltage amplification function of a SET circuit.
Figure 6:
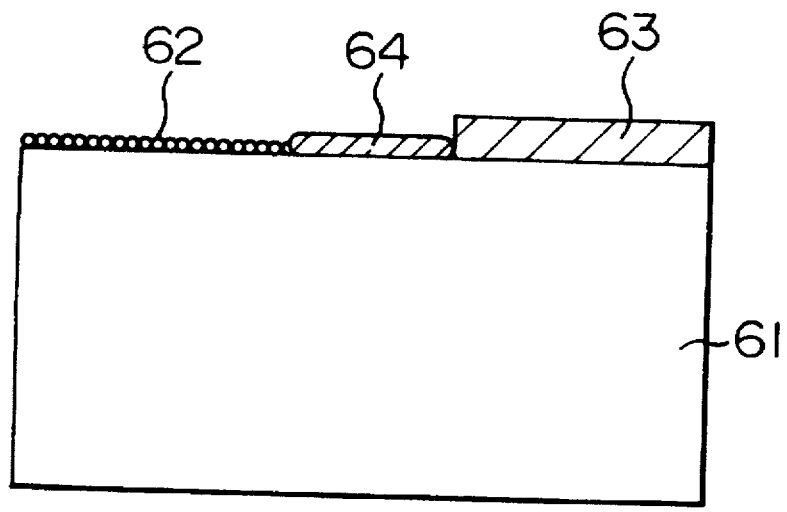
FIG. 6 is a schematic diagram showing the fundamental structure of a connection circuit with an atom level circuit and a semiconductor circuit according to the invention.

This embodiment discloses an example of the structure of a voltage amplification part of a SET circuit. FIG. 5 shows an example of the structure of a voltage amplification part of a SET circuit, the SET circuit including quantum dot 51, an input tunneling junction 52, an output tunneling junction 53, and a gate 54, respectively formed by processing an aluminum layer of 20 nm thickness formed on a silicon substrate by sputtering, by electron beam lithography and fine pattern etching technology. Reducing the size of the quantum dot by oxidating the aluminum surface layer is effective for reducing the capacitance of the quantum dot.

In this embodiment, the quantum dot having the final width of 3 nm and thickness of 5 nm can be formed. The voltage amplification part ensuring a maximum frequency of 1 tera Hertz (1 THz) and a maximum amplification factor of 1 million can be formed. It is obviously effective for stabilizing the operation by providing a noise eliminating circuit such as a circuit for preventing signal reflection at the input part and a signal stabilizing circuit or other circuits at the output part.

The SET circuit may be of an organic molecule level structure. For example, a conductive single chain polymer made of material such as acetylene and thiophene may be buried with insulating polymer such as straight chain alkane polymer as tunneling junctions. The number of atoms constituting a tunneling junction may be in the order of one to ten, and preferably two to five. The number of atoms constituting quantum dots may be in the order of one to one hundred, and preferably in the order of five to twenty from the viewpoint of operating temperature and speed. The size of a quantum dot determines the operation performance. If the operation at a low temperature is to be performed, the number of molecules may be increased more. Connection between a molecule level device and an atom level device can be achieved by attaching sulfur atoms to the end of a molecule and connecting gold atoms to the sulfur atoms. An amplified signal is supplied to a semiconductor device.

Fifth Embodiment

This embodiment discloses connection of an atom wire directly to a conductive layer formed on an insulating substrate made of single crystal silicon oxide.

Figure 7:
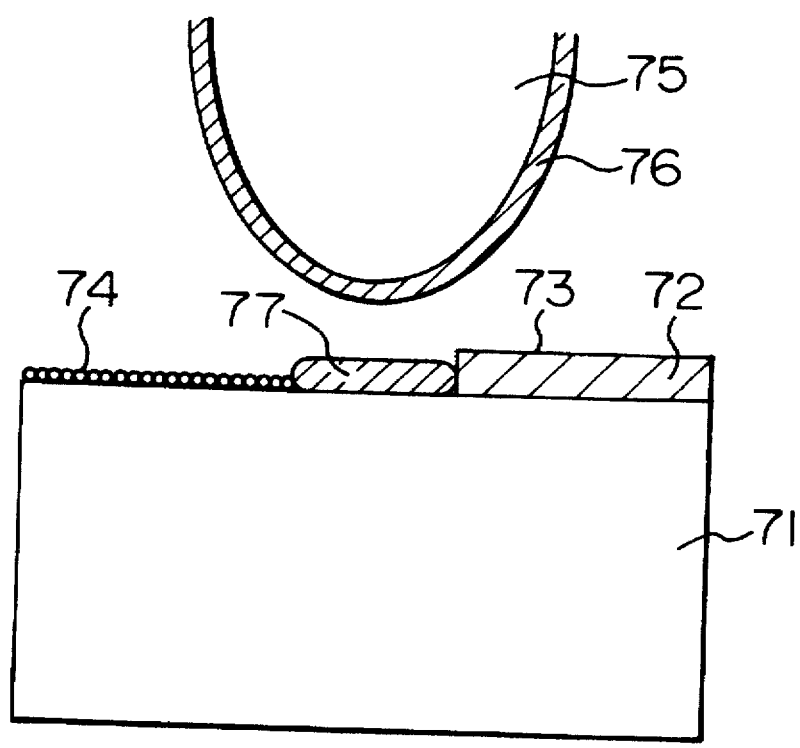
FIG. 7 is a schematic diagram showing an example of a fine connection structure connected to a metal layer deposited by a beam assist scanning tunneling microscope.

Referring to the schematic diagram shown in FIG. 7, an aluminum wiring pattern 72 having a width of 100 nm and a thickness of 100 nm is formed on an insulating substrate 71 by using semiconductor ultra-fine pattern fabrication technology. An atom wire 74 of platinum atoms arranged in a predetermined pattern is formed starting at the position apart by 20 nm from the end 73 of the wiring pattern 72 by a beam assist scanning tunneling microscope (BASTM) (U.S. Ser. No. 08/184,068 and Japanese Patent Application Ser. No. 5-217936). By using a deposition type BASTM wherein a tip of a tungsten probe 75 of a BASTM (S. Heike et al., Appl. Phys. 64 1100 (1994)) is coated with gold 76 and by applying 4 V between the probe 75 and the substrate 71, a fine connection structure 77 made of dots of gold 76 and having a diameter of about 25 nm is formed to connect the wiring pattern 72 and the atom wire 74.

With this arrangement, a fine connection structure can be formed which connects an atom level device and a device such as a semiconductor device and a quantum device. In the figures illustrating this and following embodiments, the structure connecting an atom level device and a device such as a semiconductor device and a quantum device is not always drawn by a scale proportional to an actual size.

Sixth Embodiment

Figure 8:
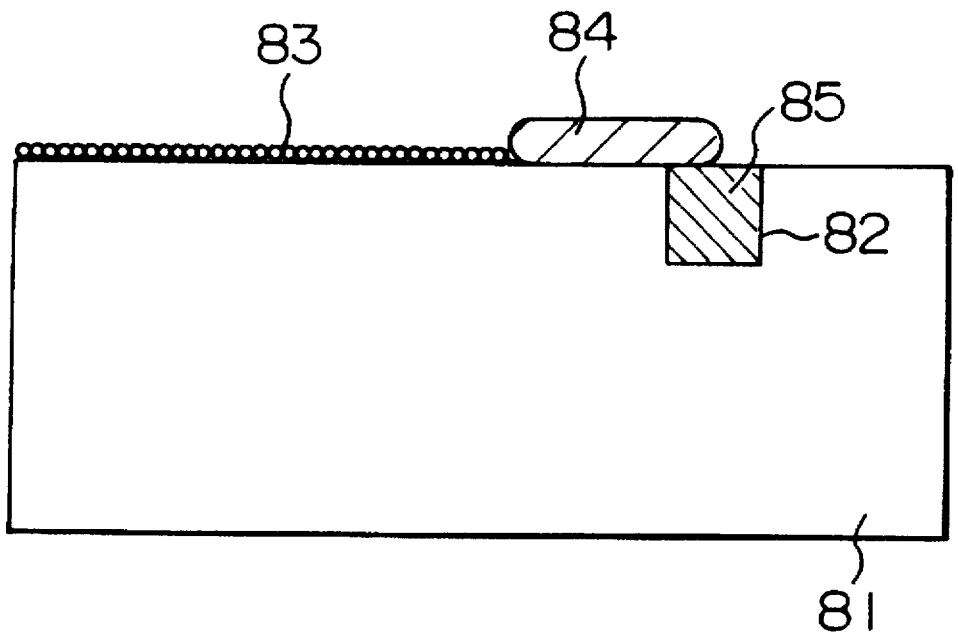
FIG. 8 is a schematic diagram showing an example of a fine connection structure formed between a conductive layer buried in an insulating substrate and an atom level device.

Referring to the schematic diagram shown in FIG. 8, a trench 82 having a width of 100 nm and a depth of 100 nm is formed on an aluminum oxide insulating substrate 81 by using ultra-fine pattern forming technology. The trench 82 is thereafter buried with a copper metal layer 85, and planarized to form a semiconductor device wiring structure having a width of 100 nm and a thickness of 100 nm. An atom level device 83 is then formed on the substrate 81 by a BASTM. By using the deposition type BASTM used by the fifth embodiment, by coating platinum on a tip surface of the tungsten probe 75, and by applying about 6 V, a fine connection structure 84 of platinum is formed. With this arrangement, a fine connection structure can be formed on generally a flat insulating surface, the structure connecting an atom level device and a device such as a semiconductor device and a quantum device.

Seventh Embodiment

This embodiment discloses an example of a fine connection structure formed on a silicon oxide film grown on a silicon wafer.

Figure 9:
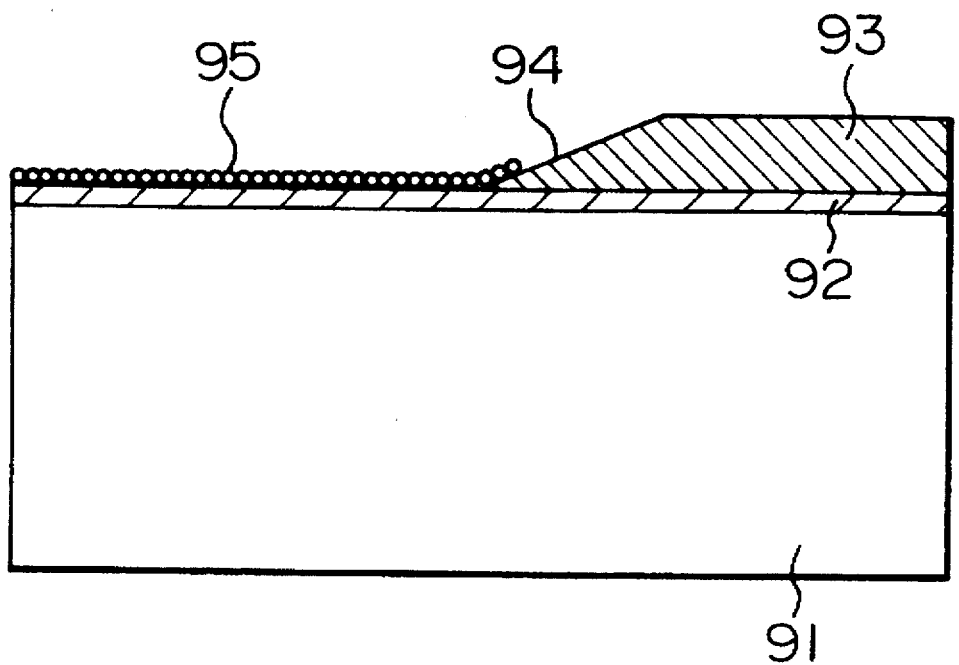
FIG. 9 is a schematic diagram showing an example of a fine connection structure formed between a slope region at the end portion of a conductive layer formed on the surface of an insulating substrate and an atom level device.

Referring to the schematic diagram shown in FIG. 9, a silicon oxide film 92 is grown on a silicon wafer 31 having the (111) plane and a resistivity of 10 Ωcm by thermal oxidation to thereby form an insulating film having generally a flat surface at atom level. Aluminum is then deposited to a thickness of 100 nm to form a wiring structure 93 having a width of 100 nm by semiconductor ultra-fine pattern fabrication technology, and heated to about 400° C. to form a gentle slope structure at the end portion of the wiring structure 93, and an atom level device 95 extending to ride on the gentle slope structure is formed.

With this arrangement, a fine connection structure can be formed which connects an atom level device and a device such as a semiconductor device and a quantum device, without forming an additional fine connection structure after the atom level device is formed.

In this embodiment, the reflow phenomenon of metal atoms by a thermal treatment is used for obtaining the gentle slope structure at the end portion 94 of the wiring structure. Obviously, other methods may be used. For example, such a gentle slope structure may be formed by photolithography as used for the formation of a wiring structure, by fine metal deposition by using a scanning tunnelling microscope disclosed by the fifth embodiment, or by mechanical work using a scanning tunneling microscope.

Eighth Embodiment

This embodiment discloses an example of a connection structure connecting an atom level device and a device such as a semiconductor device and a quantum device, respectively formed on a semiconductor substrate.

Figure 10:
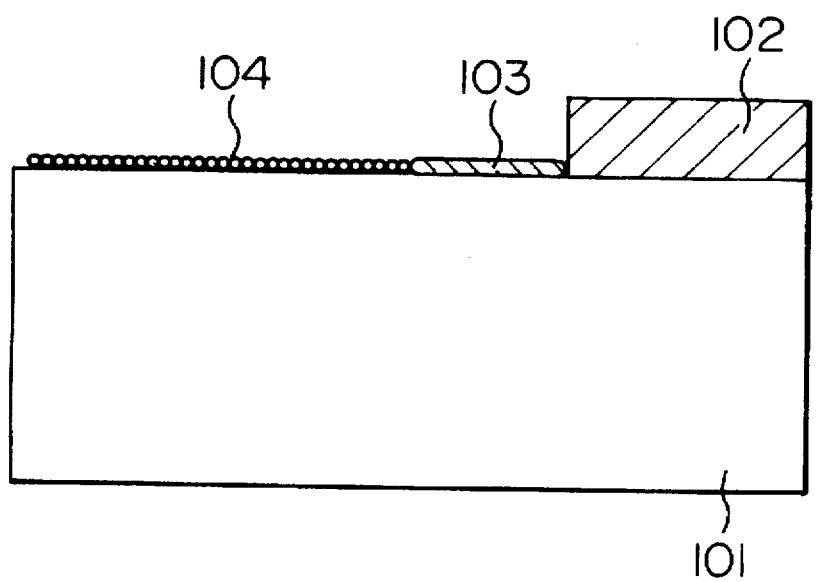
FIG. 10 is a schematic diagram showing an example of a fine connection structure formed between a conductive layer formed on the surface of a semiconductor substrate and an atom level device.

Referring to the schematic diagram of FIG. 10, a gold wiring structure 102 having a width of 200 nm and a thickness of 200 nm is formed on a gallium arsenide substrate 101, the substrate 101 with the gold wiring structure 102 is exposed in a trimethyl aluminum atmosphere to deposit an aluminum fine connection structure 103 having a width of 50 nm and a thickness of 30 nm by focused ion beam selective deposition technology, and an atom level device 104 is formed. The gallium arsenide substrate 101 is conductive at a room temperature. However, it becomes substantially a perfect insulating material if it is cooled to about 77 K. or lower. As a result, data processed by the atom level device will not flow to the substrate 101, but the data is transferred from the atom level device 104 to the gold wiring structure 102 via the aluminum fine connection structure 103.

Ninth Embodiment

This embodiment discloses a connection structure with an atom level device being buried in a substrate.

Figure 11:
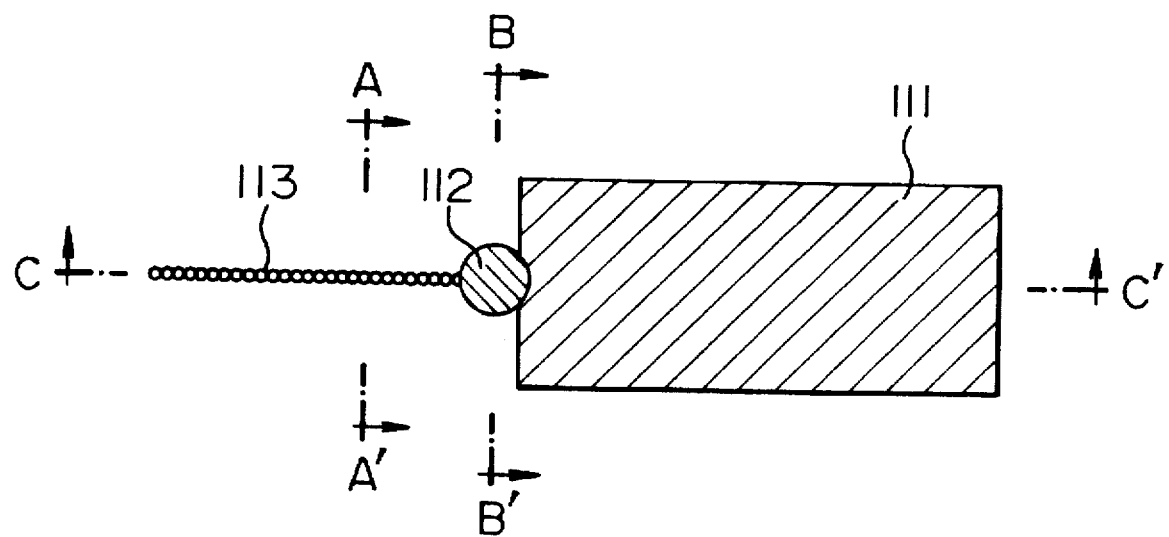
FIG. 11 is a plan view showing a fine connection structure, a conductive layer, and an atom level device.

FIG. 11 is a plan view showing a connection state of a fine connection structure 112 connecting an atom level device 113 and a semiconductor device 111. In FIG. 11 a substrate is omitted for the purpose of drawing simplicity. In realizing this arrangement, the semiconductor device 111 is first formed by a conventional semiconductor fabrication technology, the atom level device 113 is then formed, and lastly the fine connection structure 112 is formed to connect the semiconductor device 111 and the atom level device 113. The order of forming these devices and structure may be changed as desired.

Figure 12A:
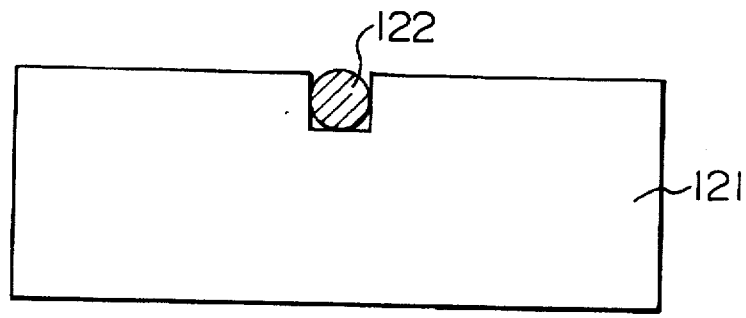
FIGS. 12A to 12C are cross sectional views corresponding to views taken along lines A-A', B-B', and C-C' of FIG. 11.
Figure 12B:
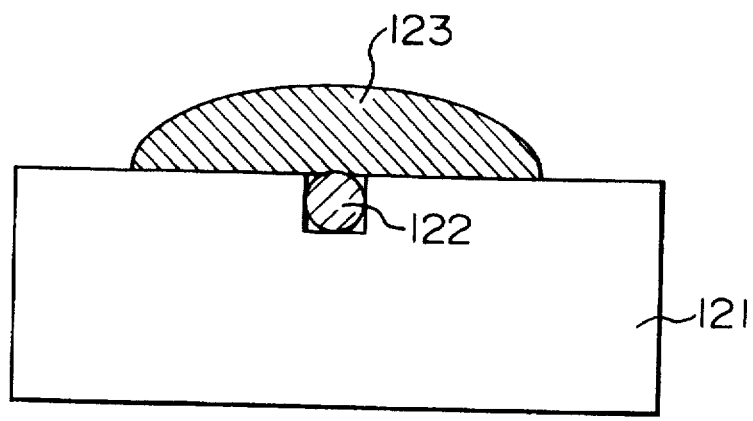
Figure 12C:
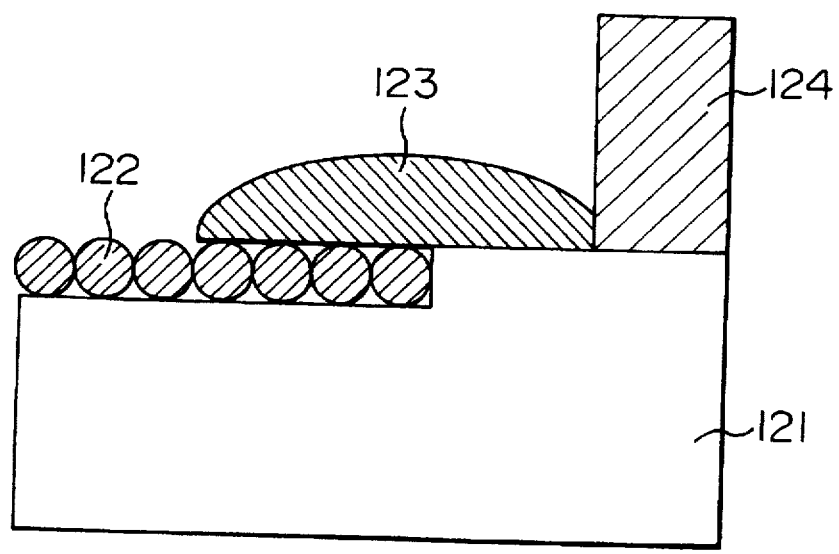

FIGS. 12A to 12C are cross sectional views corresponding to views taken along lines A–A', B–B', and C–C' of FIG. 11. FIG. 12A shows an atom level device 122 formed on a recess in a substrate 121. FIG. 12B is a cross sectional view showing a connection state of a fine connection structure 123 partially riding on the atom level device 122 and connected thereto. FIG. 12C is a cross sectional view showing a connection state of the fine connection structure 123 connected to the atom level device 123 and a semiconductor device 124. The size of the structure and the drawing scales of FIGS. 12A to 12C are different from those of FIG. 11 in order to show the details of the structure.

Tenth Embodiment

This embodiment discloses a connection state among an atom level device, a fine connection structure, and a semiconductor device.

FIG. 11A is a plan view showing fine connection structures 132 disposed between an atom level device region 133 and fine wiring lines 131 for connecting the atom level device and a semiconductor device (not shown). The number of wiring lines necessary for the atom level device is relatively limitative, including a power source line, a ground level line, input/output signal lines, and other lines.

Even if the size of the atom level device is about one thousandth of that of the semiconductor device, the length of the periphery of the atom level device region 133 is sufficiently long for disposing the necessary number of fine wiring lines 131 to the semiconductor device. For example, although the length of one side of the atom level device region 133 is only about 20 μm even if ten million gates like a general large computer are integrated, about 400 fine wiring lines 131 to a 0.1 μm-scale semiconductor device can be disposed along one side of the atom level device region 133. With a 64-bit system, the number of wiring lines including a power source line, a ground level line, input/output signal lines, and other lines are about 140 at the maximum which can be disposed easily around the atom level device region 133.

Not only logical circuits but also memory circuits can be integrated in the atom level device region 133. The performance of a computer is obviously improved considerably by integrating both types of circuits in this region 133.

If a signal amplification region is formed in the fine connection structure 132 or the fine wiring lines 131, the calculation results by the atom level device can be amplified and supplied to the semiconductor device.

Figure 13A:
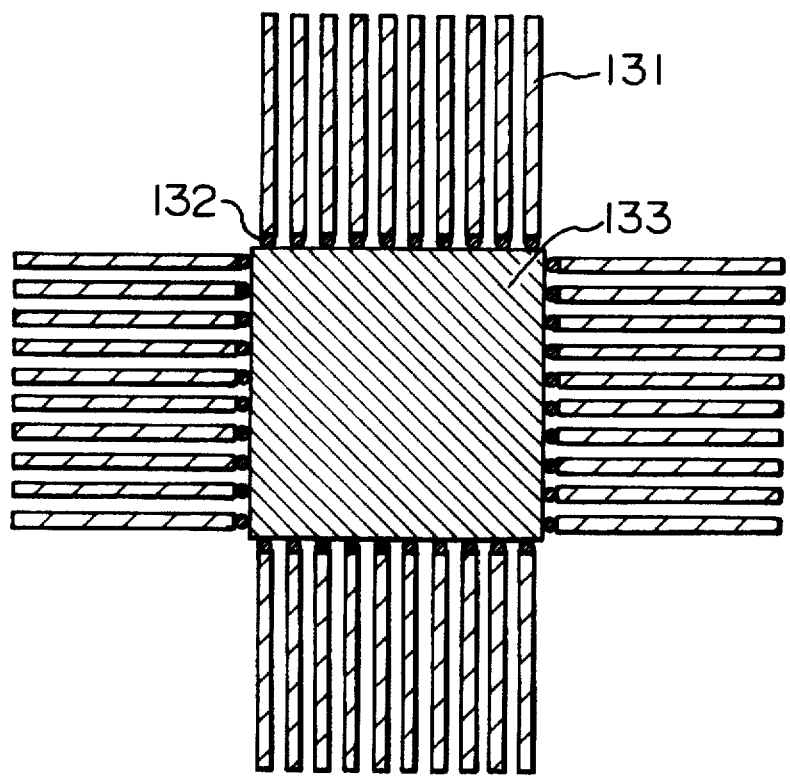
FIGS. 13A and 13B are schematic diagrams showing the mount structure of an atom level device.
Figure 13B:
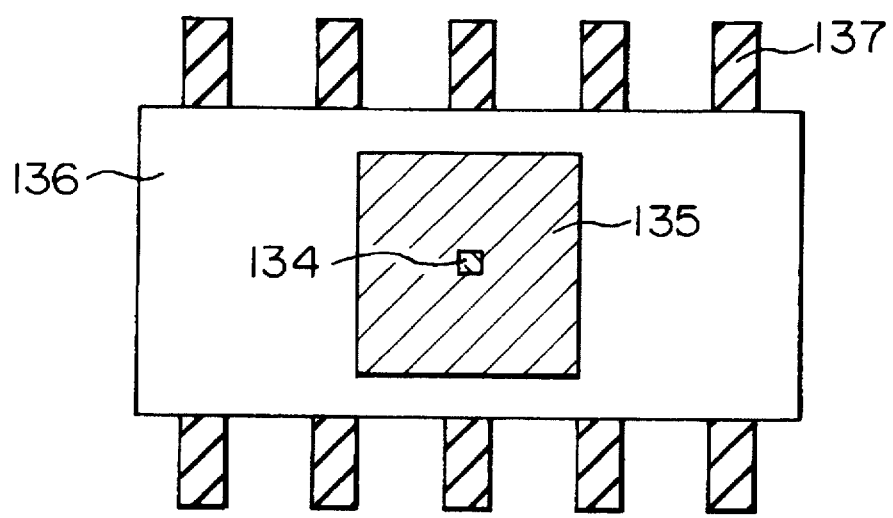

FIG. 13B shows a package 136 integrated in which are a circuit 134 including an atom level device such as shown in FIG. 13A and an integrated circuit including semiconductor devices 135 for amplifying a signal and driving an external device typically a display device. This package has pins 137 for the transfer of signals to and from an external device and for the reception of electric power, is compatible with a conventional package structure, and able to provide a necessary number of pins. A package with 500 pins or more is available so that this pin number poses no practical problem in using the atom level device of the embodiment.

As disclosed in the above embodiments, the invention provides a connection structure for connecting an atom level device and a device having a size of about 100 nm such as a semiconductor device and a quantum device. The gist of the invention obviously shows that the structures disclosed in the above embodiments may be used independently or in combination.

It is also obvious for those skilled in the art that any other film thicknesses and sizes other than those disclosed in the above embodiments may be selected so long as they are in conformity with the gist of the invention. The scale of an atom level device may be in the range from a large scale such as an ultra-high speed supercomputer to a small scale such as an ultra-high speed signal converter.

It is also obvious that a signal amplification function may be provided to a fine connection structure, and/or an atom level device, and/or a semiconductor device.

What is claimed is:

1. A circuit wherein a buffer element is disposed between an atom level circuit and a general semiconductor circuit, said atom level circuit including as a main constituent element an atom wire formed by arranging atoms in a predetermined pattern.

2. A circuit according to claim 1, wherein said buffer element is a voltage amplification circuit or element.

3. A circuit according to claim 1, wherein said buffer element is a current amplification circuit or element.

4. A circuit according to claim 1, wherein said buffer element is formed by a semiconductor ultra-fine pattern fabrication technology.

5. A circuit according to claim 1, wherein said buffer element is formed of organic level structure.

6. An electronic circuit comprising a fine connection structure for connecting a fine structure and a device such as a semiconductor device and a quantum device, said fine structure being formed on the surface of an insulating member and including at least an atom level switching device.

7. An electronic circuit according to claim 6, wherein said fine structure is partially connected to said device on substantially the same flat surface.

8. An electronic circuit according to claim 6, wherein said fine structure is partially connected to said device on substantially the same flat surface, and said fine structure and said fine connection structure are formed on said insulating member.

9. An electronic circuit according to claim 8, wherein said insulating member is made of a material selected from the group consisting of a compound insulating material such as aluminum oxide and silicon oxide, a semiconductor insulating material which becomes an insulating material when cooled, a single element insulating material such as diamond, a mixture of any ones of said materials, and a compound of any ones of said materials.

10. An electronic circuit comprising a fine connection structure for connecting a fine structure and a device such as a semiconductor device and a quantum device, said fine structure being formed on the surface of an insulating member and including at least an atom level switching device, in which the outer size r of said fine connection structure is in the range of $0.2$ nm $<r<100$ nm.

11. A buffer element disposed between an atom level circuit and a general semiconductor circuit, wherein said buffer element is a voltage amplification circuit or element formed by a semiconductor ultra-fine pattern fabrication technology, and wherein said buffer element, said atom level circuit and said general semiconductor circuit are all formed on substantially the same flat surface.

12. A buffer element disposed between an atom level circuit and a general semiconductor circuit, wherein said buffer element is a current amplification circuit or element formed by a semiconductor ultra-fine pattern fabrication technology, and wherein said buffer element, said atom level circuit and said general semiconductor circuit are all formed on substantially the same flat surface.

* * * * *